(12) United States Patent
Wang

(10) Patent No.: US 7,236,504 B2
(45) Date of Patent: Jun. 26, 2007

(54) STRETCHED-PULSE RAMAN FIBER LASERS AND METHODS OF OPERATING THE SAME

(75) Inventor: Shamino Y. Wang, San Jose, CA (US)

(73) Assignee: General Instrument Corporation, Horsham, PA (US)

( * ) Notice: Subject to any disclaimer, the term of this patent is extended or adjusted under 35 U.S.C. 154(b) by 238 days.

(21) Appl. No.: 11/030,860

(22) Filed: Jan. 7, 2005

(65) Prior Publication Data

US 2006/0153251 A1 Jul. 13, 2006

(51) Int. Cl.
*H01S 3/30* (2006.01)
(52) U.S. Cl. .................. 372/3; 372/6; 372/27; 372/106
(58) Field of Classification Search .................... 372/6, 372/3, 27, 106
See application file for complete search history.

(56) References Cited

U.S. PATENT DOCUMENTS

| | | | | |
|---|---|---|---|---|
| 5,513,194 A | | 4/1996 | Tamura et al. | |
| 5,530,582 A | * | 6/1996 | Clark | 359/333 |
| 5,617,434 A | * | 4/1997 | Tamura et al. | 372/6 |
| 6,151,160 A | * | 11/2000 | Ma et al. | 359/337.12 |
| 6,693,740 B2 | * | 2/2004 | Gray et al. | 359/337.4 |
| 2002/0181076 A1 | * | 12/2002 | Bickham et al. | 359/334 |

* cited by examiner

*Primary Examiner*—Minsun Oh Harvey
*Assistant Examiner*—Delma R. Flores-Ruiz
(74) *Attorney, Agent, or Firm*—Larry T. Cullen

(57) ABSTRACT

A method of operating a stretched-pulse Raman fiber laser includes producing laser radiation gain in a laser cavity using predominantly Raman amplification. Such a stretched-pulse Raman fiber laser has a laser cavity that includes a Negative Group Velocity Dispersion Fiber connected in series with a Positive Group Velocity Dispersion Fiber, a polarization controller and an isolator. In some examples, the Negative Group Velocity Dispersion Fiber is a Dispersion Compensating Fiber. In other examples, the Negative Group Velocity Dispersion Fiber is replaced by a Raman Specialty Fiber.

41 Claims, 3 Drawing Sheets

STRETCHED-PULSE RAMAN FIBER LASERS AND METHODS OF OPERATING THE SAME

BACKGROUND

Stretched pulse fiber lasers have been taught in the prior art. See for instance, U.S. Pat. No. 5,513,194 issued Apr. 30, 1996 to Tamura et al. ("Stretched-pulse Fiber Laser"), which is incorporated herein by reference in its entirety.

Stretched pulse fiber lasers have been shown capable of producing high energy, ultra short laser pulses. The laser cavity of a conventional stretched pulse fiber laser is formed with a negative group dispersion velocity fiber segment joined in series with a positive group dispersion velocity fiber segment. The positive group dispersion velocity fiber is typically doped with a rare earth element such as erbium or thulium and is utilized as the means of providing laser radiation gain in the laser cavity.

The physical properties of a rare earth doped fiber constrain laser radiation gain to occur in a narrow band of wavelengths. Erbium fiber based lasers, for example, are only capable of providing laser radiation gain in the 1550 nm band. Collectively, stretched pulse fiber lasers based on rare earth doped fibers have been unable to satisfy the need to produce high energy, ultra short pulses in a variety of different wavelength bands.

SUMMARY

A method of operating a stretched-pulse Raman fiber laser includes producing laser radiation gain in a laser cavity using predominantly Raman amplification. Such a stretched-pulse Raman fiber laser has a laser cavity that includes a Negative Group Velocity Dispersion Fiber connected in series with a Positive Group Velocity Dispersion Fiber, a polarization controller and an isolator. In some examples, the Negative Group Velocity Dispersion Fiber is a Dispersion Compensating Fiber. In other examples, the Negative Group Velocity Dispersion Fiber is replaced by a Raman Specialty Fiber.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

Throughout the drawings, identical reference numbers designate similar, but not necessarily identical, elements.

DETAILED DESCRIPTION

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "one embodiment" or "an embodiment" means that a particular feature, structure, or characteristic described in connection with the embodiment is included in at least one embodiment. The various appearances of the phrase "in one embodiment" in the specification are not necessarily all referring to the same embodiment.

Figure 1:
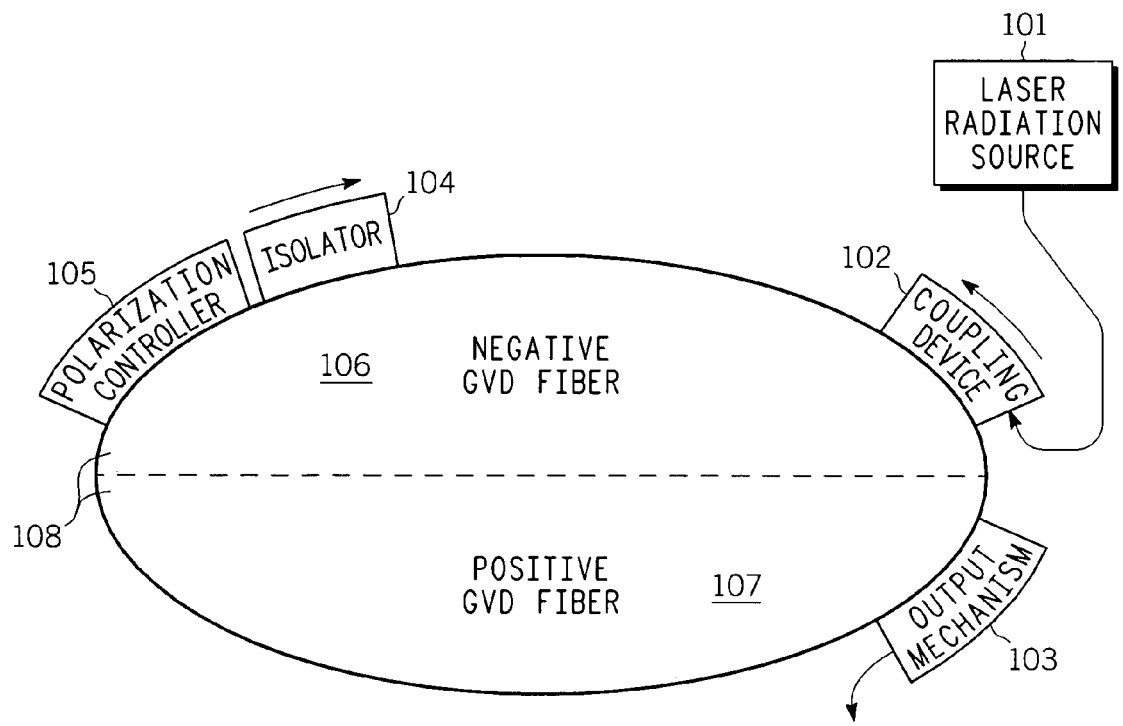
FIG. 1 shows an exemplary stretched pulse Raman fiber laser according to the principles described herein.

FIG. 1 shows an exemplary fiber laser (100) according to principles described herein. As shown in FIG. 1, the laser cavity (108) of the laser (100) is composed of two different group velocity dispersion (GVD) fibers as will be described below.

The group velocity of a wave is the velocity at which the overall shape of the wave's amplitude (known as the envelope of the wave) propagates through space. The group velocity is often thought of as the velocity at which energy is conveyed along the wave. The group velocity is defined in terms of the wave's angular frequency ($\omega$) and wave number (k). The function $\omega(k)$, which gives $\omega$ as a function of k, is known as the dispersion relation. If $\omega$ is directly proportional to k, then the group velocity is exactly equal to the phase velocity. Otherwise, the envelope of the wave will become distorted as it propagates. This "group velocity dispersion" is an important effect in the propagation of signals through optical fibers and in the design of short pulse lasers.

A group velocity dispersion (GVD) fiber will stretch or compress the pulse width of a laser pulse propagating through the cavity (108). As illustrated in FIG. 1, the laser cavity (108) of the laser (100) is formed of a negative group velocity dispersion (negative GVD) fiber segment (106) joined in series with a positive group velocity dispersion (positive GVD) fiber segment (107). The laser cavity is arranged as a ring. The positive and negative GVD fiber segments (106, 107) have opposite effects on the change in the pulse width of a pulse propagating through the cavity (108). The net group velocity dispersion in the laser cavity (108) is zero.

Laser radiation from one or more laser radiation sources (101) is introduced into the laser cavity (108) using a laser radiation coupling device (102). In some examples, the means for coupling laser radiation into the laser cavity (108) is a wave division multiplexer.

The radiation from the laser radiation sources (101) can be directed into the cavity either with or against the direction that a laser pulse is propagating in the cavity (108). Introducing laser radiation in the same direction as the propagating laser pulse is known as forward pumping. Introducing laser radiation in the direction opposite to the propagating laser pulse is known as backward pumping. Backward pumping has been shown to exhibit lower noise than forward pumping, in Raman amplification. Consequently, in some examples of the laser illustrated in FIG. 1, the laser radiation from the laser radiation sources (101) is introduced into the laser cavity (108) and directed in a direction opposite to the propagation of the laser pulse.

As shown in FIG. 1, an isolator (104) and a polarization controller (105) are included in the laser (100). The light passing through the polarization controller (105) undergoes intensity-dependent polarization. Peak intensities are polarized differently than off-peak intensities. The isolator (104) passes on-peak intensities and rejects intensities that are off-peak. The isolator (104) also rejects all radiation that is propagating in a direction opposite of the direction in which the signal is propagating. Thus, the isolator (104) and the polarization controller (105) are added to the laser (100) to ensure unidirectional propagation of on-peak intensity radiation.

This process by which on-peak intensity radiation is passed and off-peak intensity radiation is rejected as the signal propagates through the laser cavity (108) is known as mode locking or additive pulse mode locking (APM). This passive mode locking is achieved in the laser cavity by the isolator (104) and the polarization controller (105).

An output mechanism (103) or means for removing laser radiation from the laser cavity (108) is also provided. In one embodiment, the output mechanism (103) includes components capable of shaping, shortening, tuning, or otherwise altering the pulses extracted from the laser cavity as may be needed for a particular application.

Figure 2:
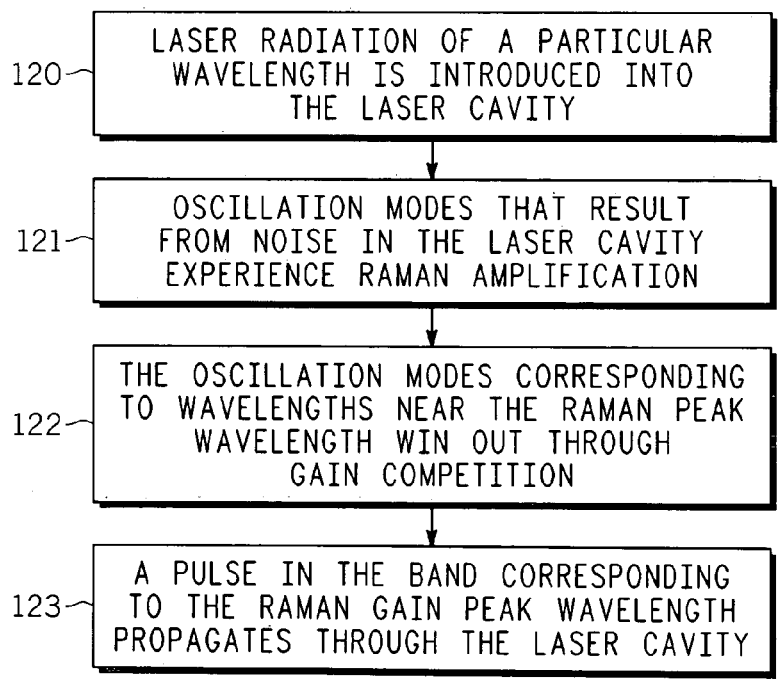
FIG. 2 is a flow chart describing the method by which high energy, ultra-short pulses in any wavelength band are produced by an exemplary stretched pulse Raman fiber laser according to principles described herein.

FIG. 2 is a flow chart that describes the method by which an exemplary stretched-pulse Raman fiber laser (100, FIG. 1) produces high energy, ultra-short pulses in a variety of wavelength bands. As shown in FIG. 2, laser radiation of a particular wavelength is coupled from a laser radiation source (101, FIG. 1) into the laser cavity (step 120). It will be apparent to one skilled in the art that the choice of wavelength of laser radiation is arbitrary among the wavelengths of laser radiation that can be produced by available components and introduced into the laser cavity (108, FIG. 1). The wavelength chosen will be that which suits a particular application.

The propagation of a signal through a fiber in which a significant amount of laser radiation is co-propagating can give rise to Raman amplification. Raman amplification occurs when radiation of sufficient intensity and appropriate wavelength is introduced into the same fiber as another signal. The wavelength of the amplifying radiation must be shorter than that of the signal to be amplified. The gain experienced by the signal is dependant, in part, on the difference between the wavelength of the signal being amplified and the wavelength of the radiation being used to amplify the signal. In Raman Amplification, the energy from photons of the amplifying radiation is converted into new photons with the wavelength of the signal being amplified. The remaining energy is absorbed as phonons. As significant laser radiation is coupled into the laser cavity (108, FIG. 1), any noise with an appropriate wavelength will undergo Raman amplification.

In addition to its dependency on wavelength, the efficiency of Raman amplification is also dependent on the physical properties of the fiber in which the gain occurs. In some examples, Raman amplification is more efficient in the negative GVD fiber (107, FIG. 1) than in the positive GVD fiber (106, FIG. 1). Thus, in some examples the laser radiation used for amplification is introduced into and propagates through the negative GVD fiber (106, FIG. 1). Any noise propagating through the negative GVD fiber segment (106, FIG. 1) will be amplified (step 121). While amplified noise would travel the ring in both directions, the isolator (104, FIG. 1) only permits unidirectional propagation of the signal.

There exists one signal wavelength, relative to the wavelength of radiation used for gain, at which the signal will experience the most gain. This maximum gain is achieved when the amplifying radiation and the signal are separated by 13 THz. If the amplifying radiation has a wavelength of 1450 nm, a signal with a wavelength of 1550 nm would be amplified the most. This wavelength at which Raman amplification creates the highest gain is known as the Raman amplification peak wavelength.

Standing wave oscillations occur when the wavelength of a signal can be multiplied by some integer to equal the length of the closed chamber in which it propagates. If L is the length of the chamber, W is the wavelength of the signal, and N is any integer, standing wave oscillations occur when L=W*N. These standing wave oscillations are also known as oscillation modes, and the integer N is known as the mode number.

Photons that are spontaneously emitted in the laser cavity (108, FIG. 1) are collectively known as noise. These photons are emitted with a wide range of wavelengths. This Noise in the laser cavity (108, FIG. 1) will give rise to a number of oscillation modes. While all modes will experience Raman amplification, the modes corresponding to the wavelengths near the Raman amplification peak wavelength will be amplified the most. Gain competition is the process by which the modes being amplified the most win out over the other modes. As a result, the wavelengths corresponding to the winning modes are substantially the only wavelengths at which non-amplifying radiation will propagate through the laser cavity. Through gain competition, the modes corresponding to wavelengths near the Raman amplification peak wavelength will win out (step 122). After the modes corresponding to the Raman amplification peak wavelength win out through gain competition and mode locking has been achieved by the polarization controller (105), a pulse in the band corresponding to the Raman amplification peak wavelength will propagate through the laser cavity (step 123) and can be extracted as needed for a laser pulse.

The stretched pulse Raman fiber laser described herein is truly self starting because no external trigger is needed in order for a laser pulse to form in the laser cavity. The laser pulse arises directly from the noise and the amplifying radiation that propagate in the cavity.

Raman amplification occurs in the stretched pulse fiber lasers of the prior art. This is in addition to the standard means of amplification employed in such fiber lasers. The standard means of amplification in previous stretched pulse fiber lasers involves exciting electrons in the Erbium doped fiber segment up to a higher energy state with laser radiation that has a wavelength of 980 nm. When the electrons in the Erbium doped fiber segment return to a lower energy state they emit a photon that has a wavelength of 1550 nm. By this means, radiation with a wavelength of 1550 nm is amplified as it travels through the Erbium doped fiber segment of conventional fiber lasers. The Raman Effect in these prior lasers results in the amplification of radiation with a wavelength substantially equal to 1022 nm. Since Raman amplification in the prior stretched pulse fiber lasers provides maximum gain to modes corresponding to a different wavelength than the radiation amplified by the standard means, the modes amplified by each process are subject to gain competition. Since the Raman Effect provides less gain than the standard means of amplification in the design of the prior stretched pulse fiber lasers, the modes amplified by the Raman Effect loses out through gain competition. Thus, the Raman Effect is suppressed in the operation of the stretched pulse fiber lasers of the prior art. Consequently, the use of Raman amplification as the predominant means of providing laser radiation gain in the laser cavity of a stretched pulse fiber laser is entirely unique to this specification.

In one example, the laser radiation source (101, FIG. 1) produces radiation with a wavelength of 1450 nm. The Raman amplification peak wavelength for radiation of this wavelength is 1550 nm. Thus, pulses in the 1550 nm band will propagate through the laser cavity (108, FIG. 1). It will be apparent to one skilled in the art, however, that the method described is FIG. 2 can be applied to produce high energy, ultra short pulses in a wide variety of wavelength bands if appropriate laser radiation sources, fibers, and coupling devices are available.

Figure 3:
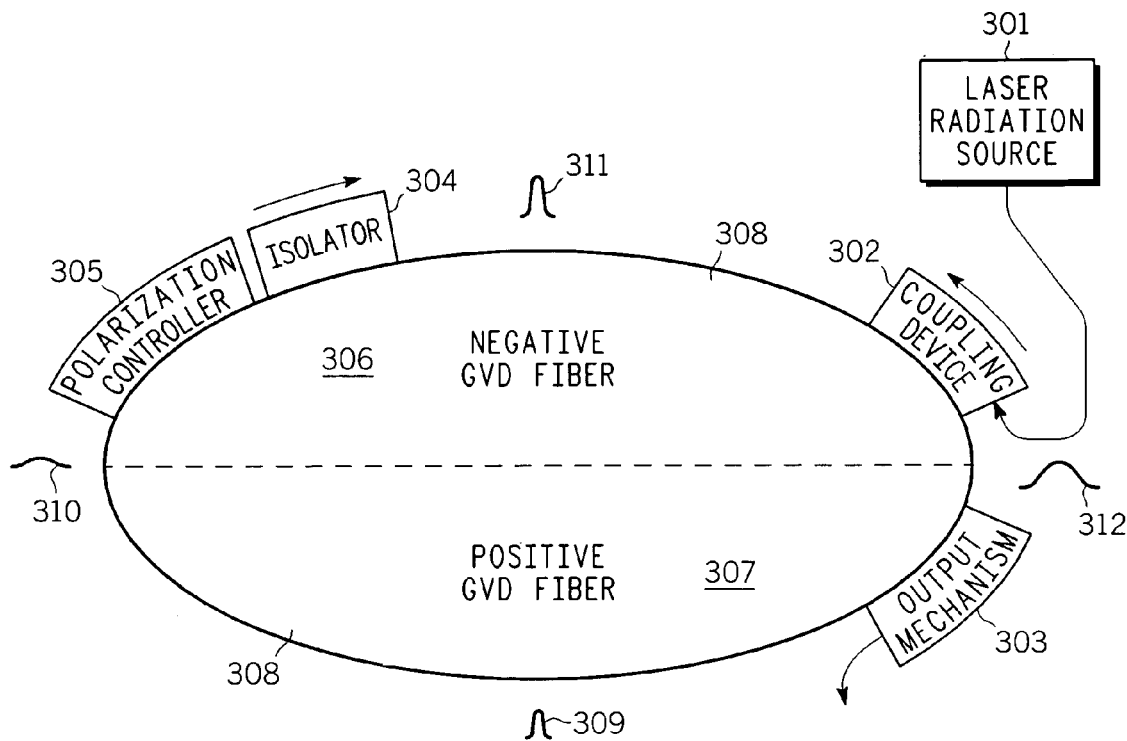
FIG. 3 shows the relative width and energy of a laser pulse as it propagates through an exemplary laser cavity according to principles described herein.

FIG. 3 shows the relative width and energy of a laser pulse as it propagates through an exemplary laser cavity (308). In one example, the isolator (304) constrains the pulse to propagate clockwise through the laser cavity. At the midpoint of the positive GVD fiber (306), the pulse width is at a minimum, the energy is relatively low and the signal has no chirp (309). Chirp is a term used to describe a change in the frequency of a signal. As a signal passes through a segment of positive GVD fiber (307), its frequency increases and it is described as having an up chirp. A down chirp is characteristic of a signal passing through a segment of fiber with negative GVD (306). When a signal has neither an up chirp nor a down chirp, the signal is said to have no chirp.

As the pulse propagates clockwise towards the junction with the negative GVD fiber (306), it widens, is attenuated, and experiences an up chirp. When the pulse reaches the junction between the positive and negative GVD fibers (307, 306), it has maximum width, minimum energy, and an up chirp (310). As the pulse propagates towards the midpoint of the negative GVD fiber (306), it narrows, is amplified by the Raman Effect, and experiences a down chirp. At the midpoint of the negative GVD fiber segment (306), the pulse has minimum width and relatively high energy (311). In addition, at the midpoint of the negative GVD (306) segment the down chirp and the up chirp, have cancelled each other out and the pulse (311) exhibits no chirp.

Continuing clockwise towards the other junction of the negative and positive GVD fiber segments (306, 307), the pulse widens, continues to be amplified, and experiences a down chirp. Arriving at the junction of the negative and positive GVD fiber segments (306, 307), the pulse exhibits maximum width, maximum energy, and a down chirp (312).

The motivation behind the stretched-pulse scheme is to generate high peak power pulse trains without triggering any undesired nonlinear effects in the fiber. Just before the output coupler (303), the pulse contains enough energy to trigger nonlinear effects, but because the energy is severely dispersed, the peak power stays below nonlinearity thresholds.

In one example, the output mechanism (303) is positioned at the beginning of the positive GVD fiber segment (307), as shown in FIG. 3, and draws most of the energy of the pulse (312) out of the laser cavity (308). The remaining energy in the pulse continues to propagate through the cavity (308312), repeating the described pattern.

Figure 4:
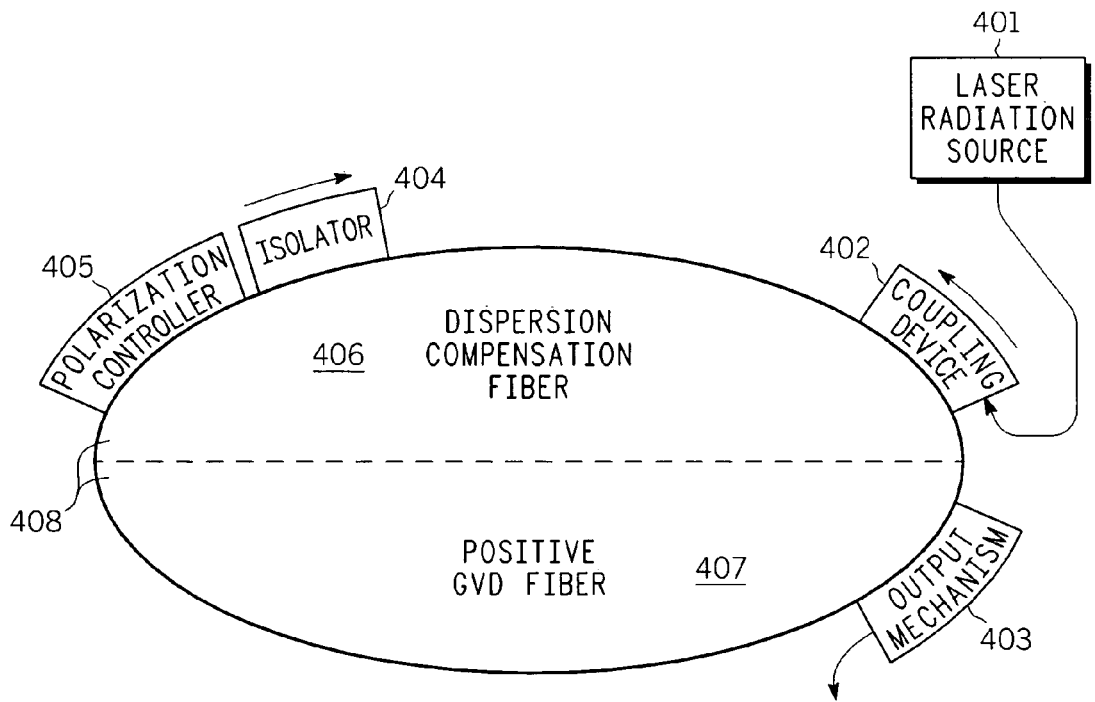
FIG. 4 shows the laser cavity of an exemplary stretched pulse Raman fiber laser using Dispersion Compensating Fiber according to principles described herein.

FIG. 4 shows the laser cavity (401) of an exemplary stretched pulse Raman fiber laser using Dispersion Compensating Fiber (DCF). The negative GVD fiber of FIG. 1 (106) is replaced in the example of FIG. 4 with a segment of Dispersion Compensating Fiber (406). Dispersion Compensating Fiber is a subset of the more general negative GVD fiber that exhibits the largest negative dispersion. DCF is often used to compensate for the positive group velocity dispersion exhibited by standard optical fiber. Placing 100 kilometers of standard optical fiber in series with 17 kilometers of DCF results in a net dispersion of zero. DCF has much narrower core than standard optical fiber. The narrow core increases the susceptibility of DCF to non-linear effects such as Raman Amplification. The Raman Effect is more efficient in DCF than in standard negative GVD fiber. This results in equivalent gain with a less powerful laser radiation source or larger gain with an equivalent laser radiation source.

Figure 5:
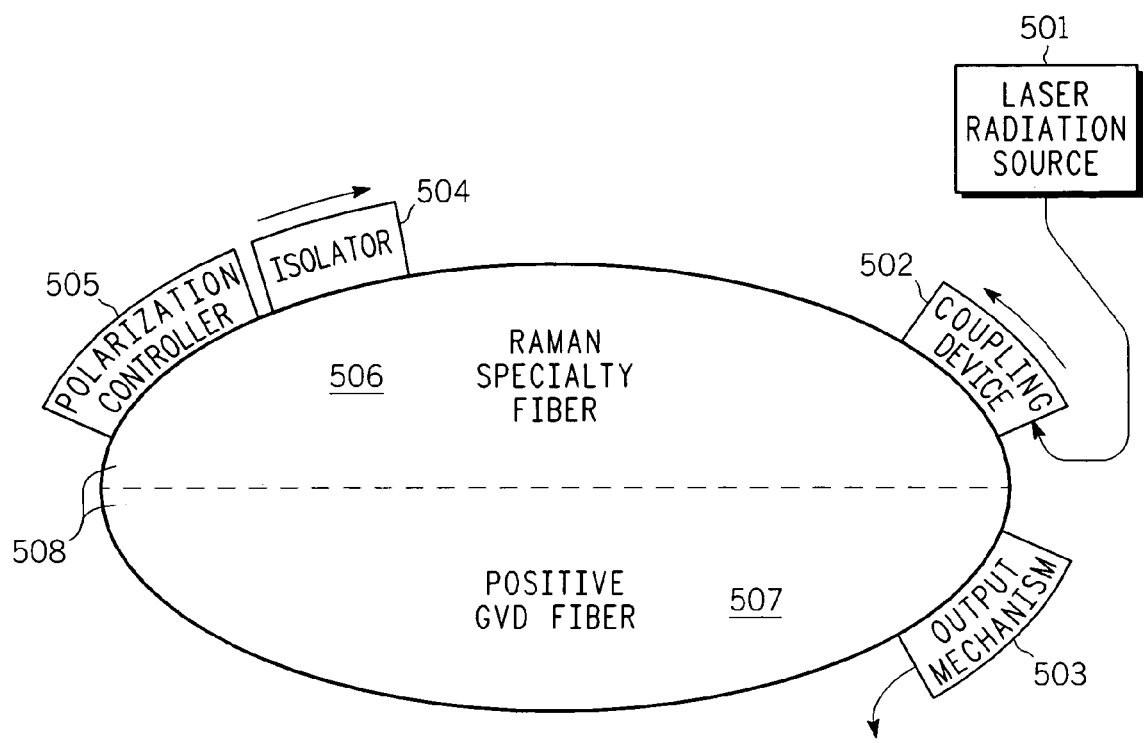
FIG. 5 shows the laser cavity of an exemplary stretched pulse Raman fiber laser using a specialty Raman Fiber according to principles described herein.

FIG. 5 shows the laser cavity of an exemplary stretched pulse Raman fiber laser using a specialty Raman Fiber. The negative GVD fiber of FIG. 1 (106) is replaced in the example of FIG. 5 by a segment of Raman Specialty Fiber (RSF) (506). Raman Specialty Fiber is specifically designed to maximize the efficiency of the Raman Effect. As with DCF, the physical properties of the core in RSF result in high Raman gain efficiency. The increased efficiency of Raman amplification in RSF results in less powerful negative GVD characteristics than exhibited by DCF. An arbitrary amount of negative dispersion is accomplished with significantly less DCF than RSF. As RSF demonstrates the highest efficiency for Raman amplification, the gain achieved in DCF or standard negative GVD fiber can be achieved in RSF with a less powerful laser radiation source.

Figure 6:
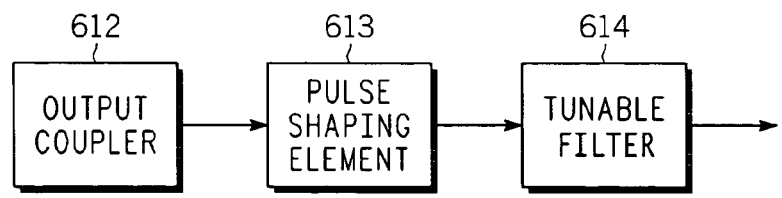
FIG. 6 shows an exemplary output mechanism of an exemplary stretched pulse Raman fiber laser according to principles described herein.

FIG. 6 shows an exemplary output mechanism of an exemplary stretched pulse Raman fiber laser. This is one example of the output mechanism (103) shown in FIG. 1. In one example, the component that couples laser radiation in the laser cavity to an output fiber is a tap coupler (612). The tapped pulse is then passed through a pulse shaping element (613) which compensates for the residual dispersion of the output pulse, thus compressing the pulse down to picosecond or femtosecond ranges. The shaped pulse is then passed through a tunable filter (614). In one example, the laser radiation source produces radiation at 1450 nm. The pulses propagating in the laser cavity (108, FIG. 1) are in the 1550 nm band. Passing the pulses through a 0.8 nm tunable filter, we obtain a tunable pulsed source for every channel in the C-band as defined by the International Telecommunication Union.

The preceding description has been presented only to illustrate and describe embodiments of the invention. It is not intended to be exhaustive or to limit the invention to any precise form disclosed. Many modifications and variations are possible in light of the above teaching.

What is claimed is:

1. A stretched-pulse Raman fiber laser having a laser cavity comprising;
   a Negative Group Velocity Dispersion Fiber connected in series with a Positive Group Velocity Dispersion Fiber;
   a polarization controller;
   an isolator; and
   an output mechanism connected to said laser cavity for outputting laser pulses;
   wherein Raman amplification is the predominant means of laser radiation gain in said laser cavity, and
   said output mechanism is positioned at a beginning of said Positive Group Velocity Dispersion Fiber in a direction in which a laser pulse propagates through said laser cavity.

2. The laser of claim 1, further comprising a laser radiation source for pumping laser radiation into said laser cavity through a coupling device.

3. The laser of claim 2, wherein said laser radiation is backward pumped into said laser cavity.

4. The laser of claim 1, wherein said output mechanism comprises a tap coupler.

5. The laser of claim 1, wherein said output mechanism comprises a pulse shaping element.

6. The laser of claim 1, wherein said output mechanism comprises a tunable filter.

7. The laser of claim 1, wherein said Negative Group Velocity Dispersion Fiber comprises Dispersion Compensating Fiber.

8. A stretched-pulse Raman fiber laser having a laser cavity comprising;
a Raman Specialty Fiber connected in series with a Positive Group Velocity Dispersion Fiber;
a polarization controller;
an isolator; and
an output mechanism connected to said laser cavity for outputting laser pulses;
wherein Raman amplification is the predominant means of laser radiation gain in said laser cavity, and
said output mechanism is positioned at a beginning of said Positive Group Velocity Dispersion Fiber in a direction in which a laser pulse propagates through said laser cavity.

9. The laser of claim 8, further comprising a laser radiation source for pumping laser radiation into said laser cavity through a coupling device.

10. The laser of claim 9, wherein said laser radiation is backward pumped into said laser cavity.

11. The laser of claim 8, wherein said output mechanism comprises a tap coupler.

12. The laser of claim 8, wherein said output mechanism comprises a pulse shaping element.

13. The laser of claim 8, wherein said output mechanism comprises a tunable filter.

14. A method of operating a stretched-pulse Raman fiber laser having a laser cavity comprising a Negative Group Velocity Dispersion Fiber connected in series with a Positive Group Velocity Dispersion Fiber, said method comprising:
producing laser radiation gain in said laser cavity using predominantly Raman amplification; and
outputting laser pulses at a position at a beginning of said Positive Group Velocity Dispersion Fiber in a direction in which a laser pulse propagates through said laser cavity.

15. The method of claim 14, further comprising polarizing a laser pulse in said laser cavity with intensity-dependent polarization wherein peak intensities are polarized differently than off-peak intensities.

16. The method of claim 15, further comprising selectively passing on-peak intensities and rejecting intensities that are off-peak in said laser pulse as said pulse propagates through said laser cavity.

17. The method of claim 16, further comprising rejecting all radiation that is propagating in a direction opposite of a direction in which said laser pulse is propagating.

18. The method of claim 14, further comprising pumping laser radiation into said laser cavity through a coupling device.

19. The method of claim 18, wherein said laser radiation is backward pumped into said laser cavity.

20. The method of claim 14, further comprising outputting laser pulses with an output mechanism connected to said laser cavity.

21. The method of claim 20, further comprising shaping said pulses with said output mechanism.

22. The method of claim 20, further comprising filtering said pulses with a tunable filter of said output mechanism.

23. The method of claim 14, wherein said Negative Group Velocity Dispersion Fiber comprises Dispersion Compensating Fiber.

24. A method of operating a stretched-pulse Raman fiber laser having a laser cavity comprising a Negative Group Velocity Dispersion Fiber connected in series with a Positive Group Velocity Dispersion Fiber, said method comprising:
introducing laser radiation of a particular wavelength into said laser cavity;
producing laser radiation gain in said laser cavity using predominantly Raman amplification; and
outputting laser pulses at a position at a beginning of said Positive Group Velocity Dispersion Fiber in a direction in which a laser pulse propagates through said laser cavity.

25. The method of claim 24, further comprising amplifying noise in said laser cavity with Raman Amplification.

26. The method of claim 25, further comprising allowing oscillation modes arising from noise and corresponding to a wavelength near the Raman gain peak wavelength to win out through gain competition to produce a pulse in a band corresponding to said Raman gain peak wavelength propagating in said laser cavity.

27. The method of claim 24, further comprising polarizing a laser pulse in said laser cavity with intensity-dependent polarization wherein peak intensities are polarized differently than off-peak intensities.

28. The method of claim 27, further comprising selectively passing on-peak intensities and rejecting intensities that are off-peak in said laser pulse as said pulse propagates through said laser cavity.

29. The method of claim 28, further comprising rejecting all radiation that is propagating in a direction opposite of a direction in which said laser pulse is propagating.

30. The method of claim 24, further comprising pumping laser radiation into said laser cavity through a coupling device, wherein said laser radiation is backward pumped into said laser cavity.

31. The method of claim 24, further comprising outputting laser pulses with an output mechanism connected to said laser cavity.

32. The method of claim 31, further comprising shaping said pulses with said output mechanism.

33. The method of claim 31, further comprising filtering said pulses with a tunable filter of said output mechanism.

34. The laser of claim 1, wherein Raman amplification includes providing amplifying radiation at a wavelength which is less than a wavelength of a signal to be amplified.

35. The laser of claim 34, wherein the wavelength of the amplifying radiation is about 13 THz away from the wavelength of the signal to be amplified.

36. The laser of claim 8, wherein Raman amplification includes providing amplifying radiation at a wavelength which is less than a wavelength of a signal to be amplified.

37. The laser of claim 36, wherein the wavelength of the amplifying radiation is about 13 THz away from the wavelength of the signal to be amplified.

38. The method of claim 14, wherein Raman amplification includes providing amplifying radiation at a wavelength which is less than a wavelength of a signal to be amplified.

39. The laser of claim 38, wherein the wavelength of the amplifying radiation is about 13 THz away from the wavelength of the signal to be amplified.

40. The method of claim 24, wherein the laser radiation is at a wavelength which is less than a wavelength of a signal to be amplified.

41. The laser of claim 40, wherein the wavelength of the laser radiation is about 13 THz away from the wavelength of the signal to be amplified.

* * * * *